United States Patent
Sawyer et al.

(10) Patent No.: US 7,999,197 B1
(45) Date of Patent: Aug. 16, 2011

(54) DUAL SIDED ELECTRONIC MODULE

(75) Inventors: Brian D. Sawyer, Carrboro, NC (US);
Milind Shah, San Diego, CA (US);
Thomas Scott Morris, Lewisville, NC (US); Carl Hinshaw, Burlington, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 298 days.

(21) Appl. No.: 12/426,385

(22) Filed: Apr. 20, 2009

(51) Int. Cl.
*H01L 23/28* (2006.01)

(52) U.S. Cl. ......... 174/522; 174/521; 257/723; 257/788

(58) Field of Classification Search .......... 174/521, 174/522; 257/723, 788
See application file for complete search history.

(56) References Cited

U.S. PATENT DOCUMENTS

| | | | |
|---|---|---|---|
| 4,891,734 A * | 1/1990 | More et al. | 361/807 |
| 5,130,889 A * | 7/1992 | Hamburgen et al. | 361/707 |
| 5,381,599 A * | 1/1995 | Hall | 29/856 |
| 5,689,089 A * | 11/1997 | Polak et al. | 174/536 |
| 5,764,484 A * | 6/1998 | Hoffman et al. | 361/761 |
| 6,473,311 B1 * | 10/2002 | James et al. | 361/777 |
| 6,693,239 B2 * | 2/2004 | Myers et al. | 174/521 |
| 6,757,181 B1 * | 6/2004 | Villanueva et al. | 361/816 |
| 6,781,066 B2 * | 8/2004 | Heng | 174/260 |
| 6,998,533 B2 * | 2/2006 | De Samber et al. | 174/521 |
| 7,078,788 B2 * | 7/2006 | Vu et al. | 257/668 |
| 7,320,738 B2 * | 1/2008 | Radenne et al. | 156/293 |
| 7,382,628 B2 * | 6/2008 | Kawamoto et al. | 361/764 |

* cited by examiner

*Primary Examiner* — Hung V Ngo
(74) *Attorney, Agent, or Firm* — Withrow & Terranova, P.L.L.C.

(57) ABSTRACT

A method for making a dual sided electronic module. A substrate has a first surface that is substantially parallel to a second surface. The second surface forms a cavity extending into an interior portion of the substrate. The substrate has at least one through hole connecting the cavity to the first surface. A first component is mounted with respect to the first surface, and a second component is mounted at least partially within the cavity. An encapsulant is applied to the first surface and through the at least one through hole into the cavity about the second component.

21 Claims, 6 Drawing Sheets

DUAL SIDED ELECTRONIC MODULE

FIELD OF THE INVENTION

The present invention relates generally to electronic modules, and in particular to dual sided electronic modules.

BACKGROUND OF THE INVENTION

Demand for increasingly smaller and thinner electronic devices, such as cell phones and the like, drives the need to increase electronic component density on printed circuit boards. One mechanism for increasing electronic component density is the use of a dual sided electronic module, sometimes referred to as a three-dimensional (3D) electronic module or package. A dual sided electronic module typically includes a laminate substrate that has a first die affixed to a top surface of the substrate and a second die affixed to a bottom surface of the substrate. Each die is encapsulated for protection. Encapsulation may involve using a molding process to protect the first die and a dispensing process for protecting the second die. The bottom surface of a dual sided electronic module typically includes ball grid array (BGA) contacts of sufficient diameter to ensure the second die does not come into contact with the surface of the printed circuit board to which the dual sided electronic module will be attached.

While a dual sided electronic module can increase lateral density on a printed circuit board, dual sided electronic modules are typically thicker than single sided electronic modules. Thus, the use of a dual sided electronic module may include a tradeoff between a decrease in space utilization in one dimension and an increase in space utilization in another dimension. Moreover, multiple process steps are required to encapsulate the two dies, which adds time, complexity, and materials compared to making a single sided electronic module. Thus, there is a need for a dual sided electronic module that can be encapsulated in a single step to reduce multiple processing steps, materials, and time. It would be further beneficial if a dual sided electronic module could be manufactured with a substantially flat bottom surface that reduces overall width of the dual sided electronic module and eliminates a need for BGA contacts.

SUMMARY OF THE INVENTION

The present invention relates to a method for making a dual sided electronic module. A laminate substrate has a first surface and a second surface. A first component, such as die or a device package, is mounted with respect to the first surface. The second surface forms a cavity extending into an interior portion of the substrate. The substrate includes a through hole that connects the cavity to the first surface. A second component is mounted at least partially in the cavity. A tape is applied to the second surface, substantially or entirely enclosing the cavity. An encapsulant is applied to the first surface and through the through hole into the cavity. The first component and the second component are encapsulated by the encapsulant.

According to one embodiment of the invention, the encapsulant is a resin and is applied under a pressure between about 600 pounds per square inch (psi) and about 750 psi. The through hole has a diameter from about 100 micrometers to about 400 micrometers. The tape is removed after the encapsulant has been applied, and the encapsulant in the cavity forms a relatively flat surface that is substantially co-planar with the second surface. Contacts of the first and second components are electrically coupled to land grid array (LGA) contacts on the second surface.

According to another embodiment of the invention, the substrate includes a plurality of through holes that connect the cavity to the first surface. One or more of the through holes enable the encapsulant to flow into the cavity while other through holes enable gases associated with the encapsulant, or otherwise present in the cavity, to vent.

The first surface may form a second cavity that extends into an interior portion of the substrate. The first component may be mounted partially or entirely in the second cavity, further decreasing a height of the dual sided electronic module. The plurality of through holes may have any cross-sectional shape sufficient to enable the encapsulant to flow therethrough, or to allow gases to vent. The through holes need not have a uniform cross-sectional shape, and may, for example, taper from the first surface to the cavity, or vice versa. If multiple through holes are used, the through holes may be positioned with respect to a resin flow direction such that resin may enter certain of the through holes at substantially the same time.

The present invention also relates to a dual sided electronic module that includes a substrate having a first surface, and a second surface which includes a cavity that extends into an interior portion of the substrate. The substrate includes a through hole that connects the cavity to the first surface. A first component is fixed with respect to the first surface and is encapsulated in a first encapsulant mass. A second component is mounted at least partially in the cavity and is encapsulated in a second encapsulant mass. The through hole includes a third encapsulant mass that is contiguous with the first encapsulant mass and the second encapsulant mass.

The first surface is preferably substantially parallel to the second surface. The second encapsulant mass preferably forms a substantially flat surface that is substantially co-planar with the second surface. Each of the first and second components can comprise a die or a device package, which can include one or more die, active or passive components, or a combination thereof in a molded body. Dies may be electrically coupled to the substrate using direct chip attached (DCA) technologies, such as a flip chip, or via wires. Similarly, device packages may be electrically coupled using surface mount technologies, or via wires. According to one embodiment of the invention, LGA contacts positioned with respect to the second surface are electrically coupled to the first component and the second component. The first surface may also have a second cavity that extends into an interior portion of the substrate. The first component may be partially or entirely located within the second cavity.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a dual sided electronic module and a process for making the dual sided electronic module. The dual sided electronic module includes a substrate having a cavity formed on a bottom surface of the substrate that extends into an interior portion of the substrate. A component, such as a die or a device package, is mounted within the cavity. An encapsulant mass protects the component and forms a flat surface that is substantially co-planar with the bottom surface of the substrate. The bottom surface can include land grid array (LGA) contacts for coupling the dual sided electronic module to another electronic module, or to a printed circuit board, for example. A top surface of the substrate also includes an electronic component encapsulated in an encapsulant mass. The dual sided electronic module of the present invention enables multiple components to be included in an electronic module having a height similar or identical to a single sided electronic module. The electronic module can be manufactured such that components on each surface of the substrate are encapsulated in the same process step, which reduces materials and process complexity.

Figure 1:
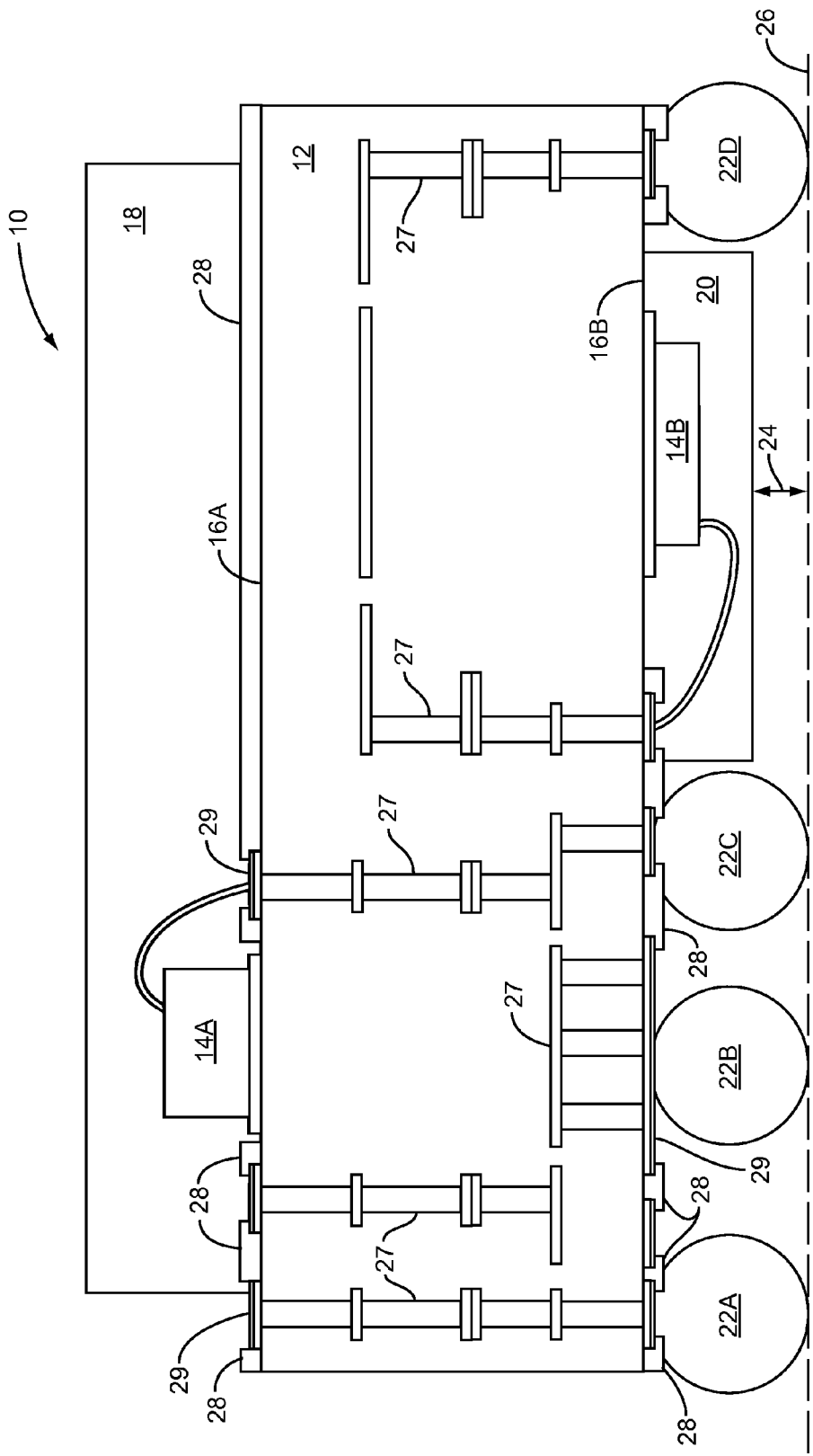
FIG. 1 is a block diagram showing a cross-section of a prior art dual sided electronic module.

FIG. 1 is a block diagram illustrating a cross-section of a prior art dual sided electronic module 10. A substrate 12 includes dies 14A, 14B mounted with respect to top and bottom surfaces 16A, 16B respectively. Multiple process steps are required to provide suitable protection for the dies 14A, 14B. The die 14A is typically first encapsulated in a resin 18 via a molding process. The substrate 12 is then flipped, and the die 14B is then typically encapsulated in an encapsulant 20 via a dispensing process. Due to an offset of the die 14B and the encapsulant 20 from the bottom surface 16B, ball grid array (BGA) contacts 22A-22D are used to provide a clearance 24 between a perimeter of the encapsulant 20 and a surface 26 of a device, such as a printed circuit board, to which the dual sided electronic module 10 may be later affixed. The BGA contacts 22A-22D are electrically coupled to conductive paths 27 to provide signal paths to the dies 14A, 14B. As is known to those skilled in the art, the dual sided electronic module 10 may also include solder mask areas 28 and conductive surface finish areas 29.

Figure 2A:
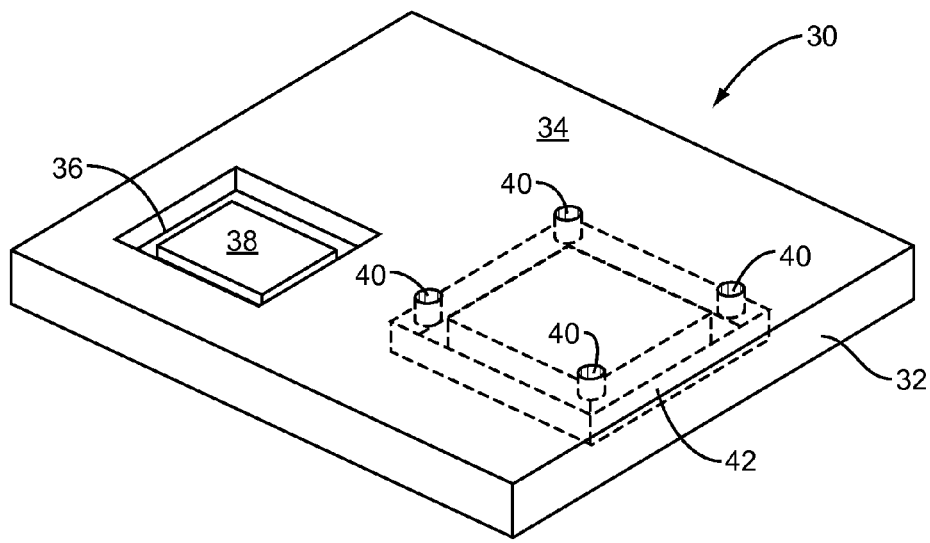
FIG. 2A is an orthogonal view of a block diagram showing aspects of a first side of a dual sided electronic module according to one embodiment of the invention.

FIG. 2A is an orthogonal view of a block diagram showing aspects of a first side of a dual sided electronic module 30 according to one embodiment of the present invention. A substrate 32 includes a first, or top, surface 34. The first surface 34 forms a cavity 36 that extends into an interior portion of the substrate 32. A first component 38 is mounted in the cavity 36. The substrate 32 can comprise any suitable substrate known to those skilled in the art for making electronic modules, including, for example, a copper clad core material with a glass reinforced, organic resin-based prepreg, such as may be available from Isola Group. Components suitable for the present invention, such as the first component 38 and a second component 46, discussed below, can comprise a die or a device package which can include one or more die, active or passive components, or a combination thereof in a molded body. Dies may be electrically coupled to the substrate 32 using direct chip attached (DCA) technologies, such as a flip chip, or via wires. Similarly, device packages may be electrically coupled to the substrate 32 using surface mount technologies, or via wires. Use of the cavity 36 in the first surface 34 to completely or entirely contain the first component 38 is optional, but may be desirable to reduce an overall height of the dual sided electronic module 30. The substrate 32 also includes through holes 40 which connect a cavity 42 to the first surface 34.

Figure 2B:
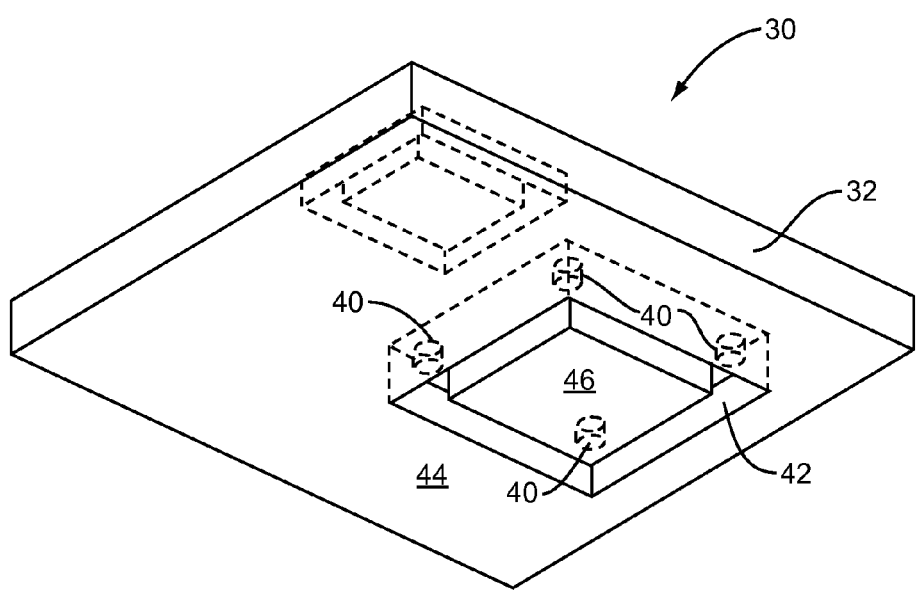
FIG. 2B is an orthogonal view of a block diagram showing aspects of a second side of the dual sided electronic module illustrated in FIG. 2A.

FIG. 2B is an orthogonal view of a block diagram showing aspects of a second side of the dual sided electronic module 30 illustrated in FIG. 2A. A second, or bottom, surface 44 forms the cavity 42 which extends into an interior portion of the substrate 32. A second component 46 is mounted in the cavity 42, preferably such that the second component 46 resides completely or entirely within the cavity 42. The through holes 40A, 40B connect the cavity 42 to the first surface 34.

Figure 3:
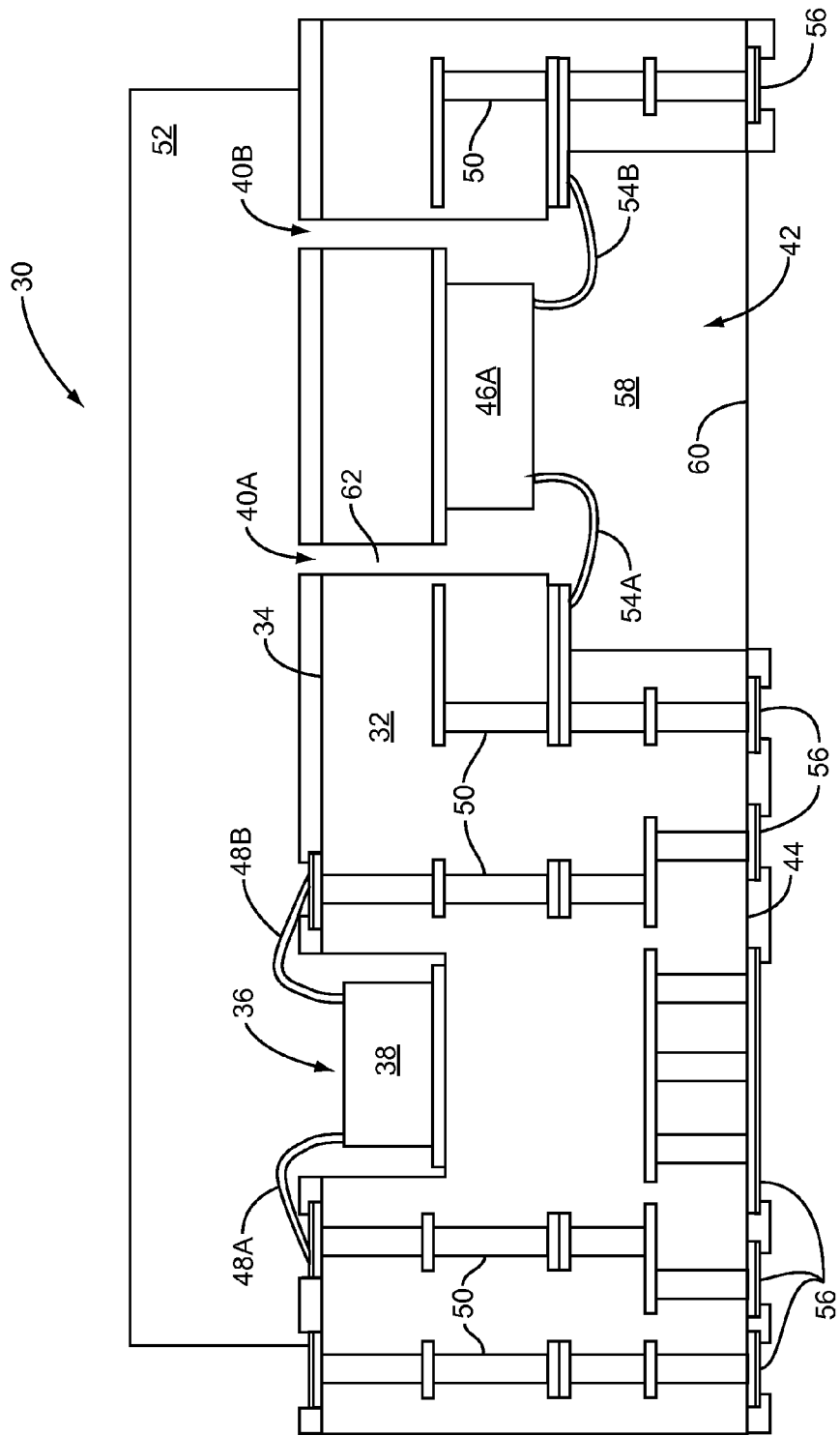
FIG. 3 is a block diagram of a cross-section of a dual sided electronic module having a wire-bond die mounted in a cavity according to one embodiment of the invention.

FIG. 3 is a block diagram of a cross-section of a dual sided electronic module 30 according to one embodiment of the invention. The first component 38 is mounted with respect to the first surface 34 in the cavity 36. The first component 38 in the embodiment illustrated in FIG. 3 is a wire bond die wherein the first component 38 is electrically coupled to metal contacts on the substrate 32 via wires. Wires 48A, 48B are coupled to conductive paths 50 to enable signals to propagate between the first component 38 and a device coupled to the conductive paths 50. A first encapsulant mass 52 encapsulates the first component 38 and portions of the first surface 34 to stabilize and protect the first component 38. The second component 46A is mounted completely in the cavity 42. The second component 46A is also a wire bond die wherein wires 54A, 54B are coupled to the conductive paths 50 to enable signals to propagate between the second component 46A and LGA contacts 56. A second encapsulant mass 58 encapsulates the second component 46A. The second encapsulant mass 58 may be the same material as the first encapsulant mass 52. Notably, the wires 54A, 54B are completely encapsulated within the second encapsulant mass 58 and are contained completely within the cavity 42. Also notably, the second encapsulant mass 58 has a portion 60 that is substantially flat and co-planar with the second surface 44.

A third encapsulant mass 62 is contained in the through hole 40A and is of the same material and contiguous with the first encapsulant mass 52 and the second encapsulant mass 58. The through holes 40A, 40B may have any cross-sectional shape sufficient to enable the encapsulant to flow into the cavity 42, or to allow gases to vent from the cavity 42 during a molding process, as described in greater detail herein. The through holes 40A, 40B need not have a uniform cross-sectional shape, and may, for example, taper from the first surface 34 to the cavity 42, or vice versa. If multiple through holes 40A, 40B are used, the through holes 40A, 40B may be positioned with respect to an encapsulant flow direction such that the encapsulant may enter the through holes 40A, 40B at substantially the same time.

Figure 4:
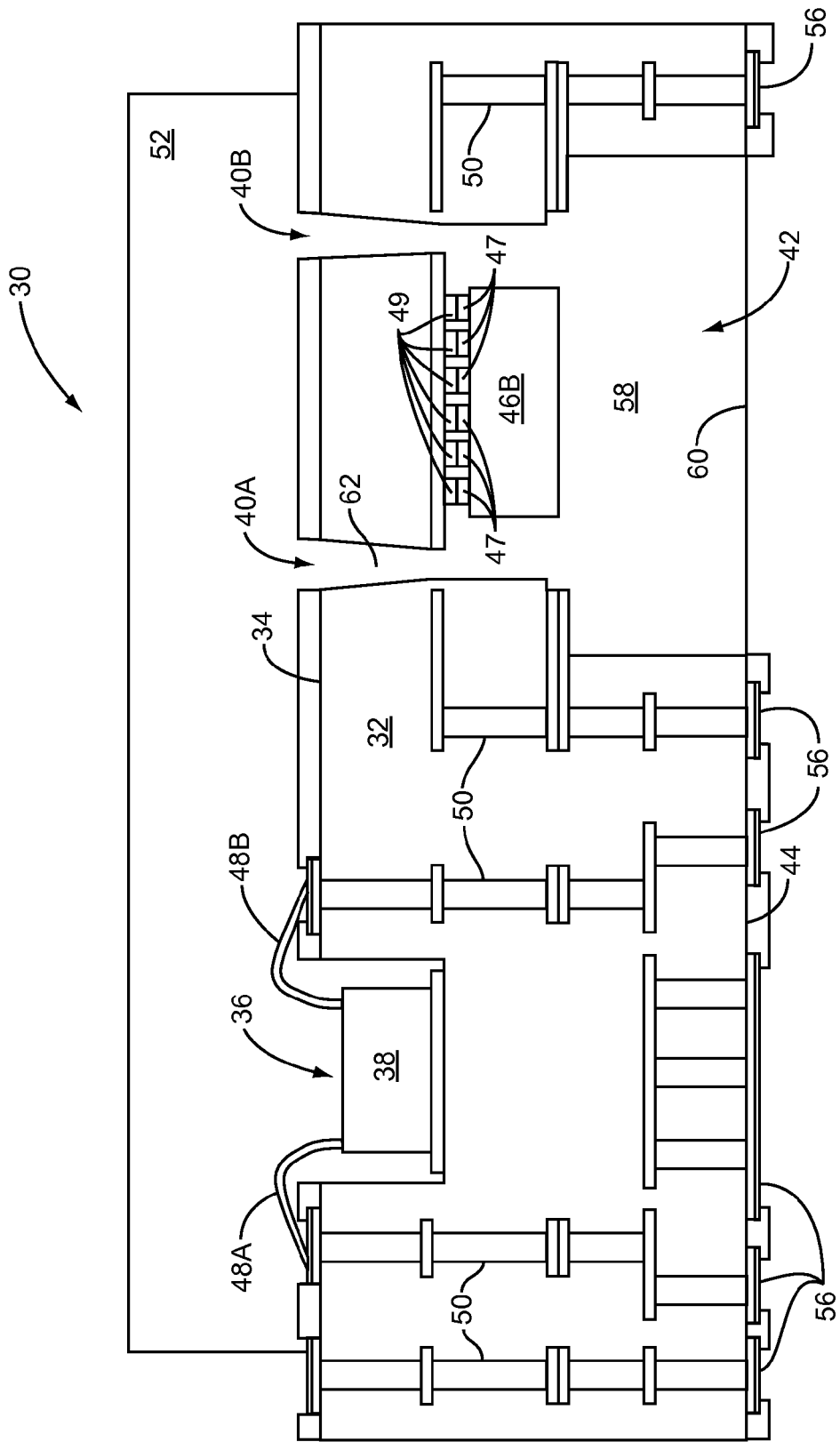
FIG. 4 is a block diagram of a cross-section of a dual sided electronic module having a flip chip die mounted in a cavity according to one embodiment of the invention.

FIG. 4 is a block diagram of a cross-section of a dual sided electronic module 30 according to another embodiment of the invention. FIG. 4 is similar to the dual sided electronic module 30 illustrated in FIG. 3, except the second component 46B of FIG. 4 is a DCA die, such as a flip chip. The second component 46B is electrically coupled to the conductive paths 50 via pads 47 on the second component 46B which are coupled to conductive contacts 49 on the substrate 32.

Figure 5:
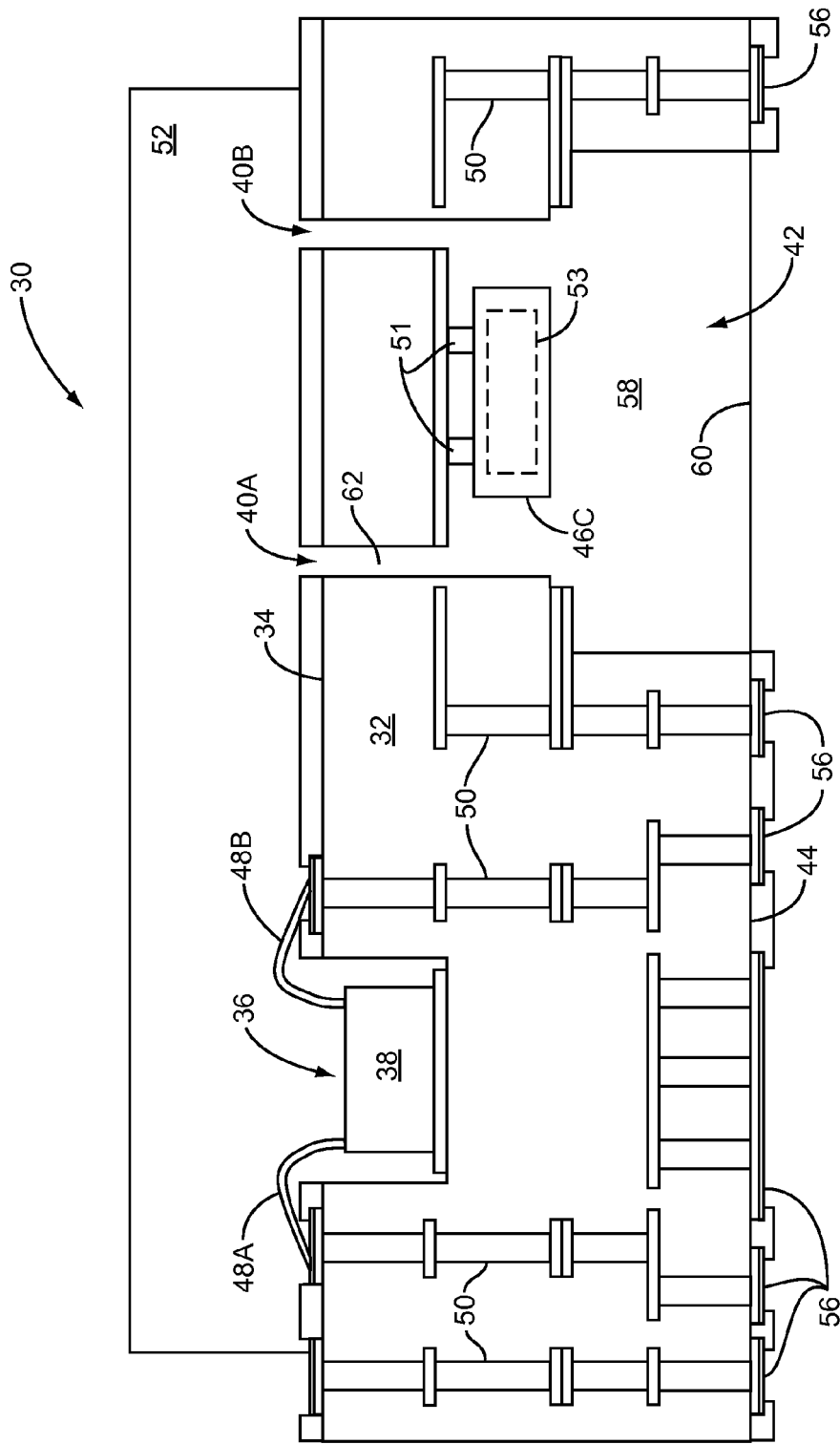
FIG. 5 is a block diagram of a cross-section of a dual sided electronic module having a device package mounted in a cavity according to one embodiment of the invention.

FIG. 5 is a block diagram of a cross-section of a dual sided electronic module 30 according to another embodiment of the invention. FIG. 5 is similar to the dual sided electronic module 30 illustrated in FIG. 3, except the second component 46C is a device package comprising or more die, active or passive components 53, or a combination thereof. The second component 46C is electrically coupled to the conductive paths 50 via a surface mount technology 51, such as via pins, leads, contacts, solder balls, or the like.

Figure 6:
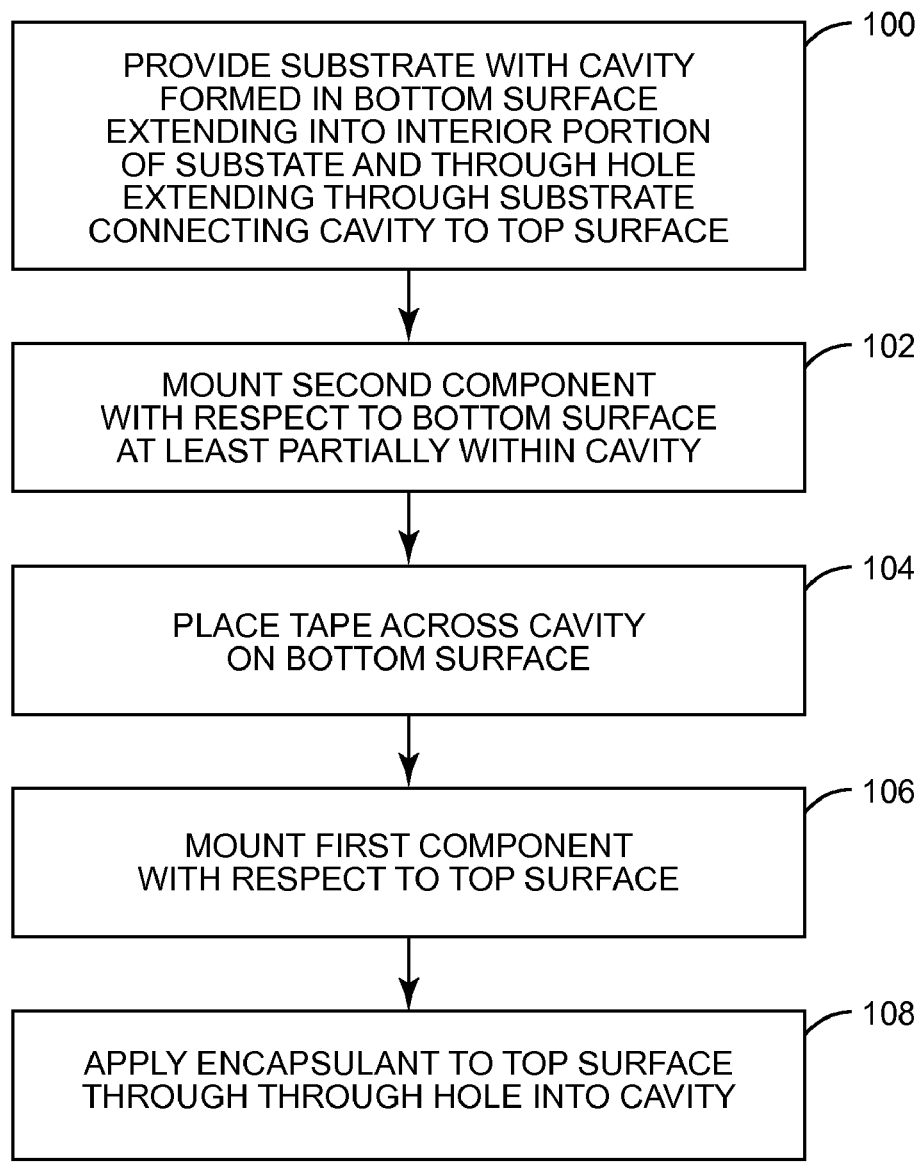
FIG. 6 is a flow chart illustrating a process for making a dual sided electronic module according to one embodiment of the invention.

FIG. 6 is a flow chart illustrating a process for making a dual sided electronic module according to one embodiment of the present invention. For purposes of illustration, FIG. 6 will be discussed with reference to FIG. 3. The process for making the dual sided electronic module 30 according to one embodiment of the present invention begins with the substrate 32 having the second surface 44 forming the cavity 42 that extends into an interior portion of the substrate 32. One or more through holes 40 extend through the substrate 32 to connect the first surface 34 with the cavity 42 (step 100). While the discussion herein will refer to making a single dual sided electronic module 30, those skilled in the art will appreciate that during a manufacturing process a plurality of dual sided electronic modules 30 will be made, and will ultimately be singulated into separate individual dual sided electronic modules 30.

The second component 46A is mounted with respect to the second surface 44 at least partially within the cavity 42 (step 102). The second component 46A may be mounted with respect to the second surface 44 through a mounting technology used for the respective type of component 46A, such as, for example, a DCA technology, an epoxy, a surface mount technology, and the like. Assume that the second component 46A is a wire bond die and is mounted with respect to the second surface 44 via an epoxy. After the epoxy cures, the wires 54A, 54B, such as 0.001" Au wires, may be connected between the conductive paths 50 formed in the substrate 32 and contacts contained on the second component 46A. Next, a tape, such as Kapton™ tape, is placed on the second surface 44 so as to substantially or entirely enclose the cavity 42 (step 104). The first component 38 is then mounted with respect to the first surface 34. The first component 38 may be mounted within a cavity 36 formed by the first surface 34 that extends into the substrate 32, or may be mounted on the first surface 34. The first component 38 is typically fixed with respect to the first surface 34 through the use of an epoxy or other suitable attachment technology (step 106). If the first component 38 is a flip chip, the first component 38 may be dipped in flux, positioned on the first surface 34, and reflowed. If the first component 38 is an SMT component, the first component 38 may be fixed using a screened solder and reflowed.

The substrate 32 is then loaded into a mold chase. Mold tooling clamps on top of the substrate 32 to form a top cavity. The top cavity is typically between about 0.5 millimeters (mm) and about 1.2 mm. Prior to applying an encapsulant, a vacuum is preferably applied to remove all air from the cavity 42 and the top cavity. An encapsulant, such as a molding resin, for example a thermo-set material with silicon filler, is heated to between about 160 degrees Centigrade and about 180 degrees Centigrade. A molding press then compresses the encapsulant under pressure ranging from about 600 pounds per square inch (psi) to about 750 psi. The encapsulant is applied to the first surface 34 and then through the through holes 40 and into the cavity 42 (step 108). The Kapton™ tape applied to the second surface 44 of the substrate 32 contains the second encapsulant mass 58 and results in a substantially flat surface that is substantially co-planar with the second surface 44.

The present invention enables the manufacture of a dual sided electronic module in fewer process steps than conventional dual sided electronic modules and using fewer encapsulant materials. The dual sided electronic module of the present invention has a reduced height compared to conventional dual sided electronic modules through the use of one or more cavities formed on the surfaces of the substrate that extend into an interior portion of the substrate. The dual sided electronic module of the present invention has a substantially flat bottom surface that enables the use of LGA contacts rather than BGA contacts, further reducing the overall height of the dual sided electronic module.

Those skilled in the art will recognize improvements and modifications to the preferred embodiments of the present invention. All such improvements and modifications are considered within the scope of the concepts disclosed herein and the claims that follow.

What is claimed is:

1. A method of making an electronic module comprising:
providing a substrate having a first surface and a second surface, the second surface forming a cavity extending into an interior portion of the substrate, the substrate having at least one through hole connecting the cavity to the first surface;
mounting a first component with respect to the first surface;
mounting a second component at least partially within the cavity; and
applying an encapsulant to the first surface and through the at least one through hole into the cavity and about the second component.

2. The method of claim 1 wherein applying the encapsulant to the first surface further comprises applying the encapsulant about the first component.

3. The method of claim 1 wherein the substrate has at least two through holes, and wherein one of the at least two through holes provides a vent for gases associated with the encapsulant.

4. The method of claim 1 further comprising applying a tape to the second surface of the substrate prior to applying the encapsulant applied to the first surface through the at least one through hole to inhibit the encapsulant from extending beyond the second surface, wherein a substantially flat surface that is colinear with the second surface is formed by the encapsulant.

5. The method of claim 1 wherein the first component is a die and the second component is a device package.

6. The method of claim 1 wherein the second component is a wire bond die.

7. The method of claim 6 further comprising affixing a plurality of wires between a first plurality of respective contacts on the wire bond die and a second plurality of respective contacts on the substrate, wherein an entire length of each of the plurality of wires remains within the cavity.

8. The method of claim 1 wherein the second component is electrically coupled to the substrate by one or more conductive pads.

9. The method of claim 1 wherein the second component is electrically coupled to the substrate by one or more wires.

10. The method of claim 1 wherein the encapsulant comprises a resin and is applied to the first surface at a pressure in a range from about 600 pounds per square inch (psi) to about 750 psi.

11. The method of claim 1 wherein the encapsulant comprises a resin and is applied to the first surface at a temperature in a range from about 160 degrees Centigrade to about 180 degrees Centigrade.

12. The method of claim 1 wherein the at least one through hole has a diameter in a range of about 100 micrometers to about 400 micrometers.

13. An electronic module comprising:
- a substrate comprising a first surface, a second surface having a first cavity extending therethrough into a first interior portion of the substrate, and at least one through hole in the substrate connecting the first cavity with the first surface;
- a first component mounted with respect to the first surface and embedded in a first encapsulant mass;
- a second component mounted at least partially within the first cavity and embedded in a second encapsulant mass comprises the same material as the first encapsulant mass; and
- a third encapsulant mass in the at least one through hole contiguous with the first encapsulant mass and the second encapsulant mass.

14. The electronic module of claim 13 wherein the second surface is substantially parallel to the first surface.

15. The electronic module of claim 13 wherein the second component is mounted completely within the first cavity, and wherein the second encapsulant mass forms a substantially flat surface that is in substantially a same plane as the second surface.

16. The electronic module of claim 15 wherein the second component is a wire bond die.

17. The electronic module of claim 15 wherein the second component is a flip chip die.

18. The electronic module of claim 13 further comprising a plurality of land grid array (LGA) contacts positioned with respect to the second surface, a first of the plurality of LGA contacts electrically coupled to the first component and a second of the plurality of LGA contacts electrically coupled to the second component.

19. The electronic module of claim 13 wherein the first surface has a second cavity extending therethrough into a second interior portion of the substrate, and wherein the first component is mounted at least partially within the second cavity.

20. The electronic module of claim 13 wherein the at least one through hole has a diameter in a range of about 100 micrometers to about 400 micrometers.

21. The electronic module of claim 13 wherein the substrate has at least two through holes, and wherein a second of the at least two through holes provides a vent for gases associated with the second encapsulant mass.

* * * * *